United States Patent [19]

Brzozowski

[11] 3,852,805

[45] Dec. 3, 1974

[54] HEAT-PIPE COOLED POWER SEMICONDUCTOR DEVICE ASSEMBLY HAVING INTEGRAL SEMICONDUCTOR DEVICE EVAPORATING SURFACE UNIT

[75] Inventor: Steven J. Brzozowski, Saratoga, N.Y.

[73] Assignee: General Electric Co., Schenectady, N.Y.

[22] Filed: June 18, 1973

[21] Appl. No.: 370,937

[52] U.S. Cl. .......................... 357/82, 174/15, 165/80, 165/105, 357/78

[51] Int. Cl. .............................. H01l 3/00, H01l 5/00

[58] Field of Search ................ 317/234, 1, 1.5, 6, 5; 174/15; 165/105, 80; 62/119

[56] References Cited

UNITED STATES PATENTS

| | | | |
|---|---|---|---|
| 3,736,474 | 5/1973 | Sias | 317/234 P |
| 3,739,234 | 6/1973 | Bylund et al. | 317/234 B |
| 3,739,235 | 6/1973 | Kessler | 317/234 B |
| 3,746,947 | 7/1973 | Yamamoto | 317/234 A |

*Primary Examiner*—Andrew J. James
*Attorney, Agent, or Firm*—Louis A. Moucha; Joseph T. Cohen; Jerome C. Squillaro

[57] ABSTRACT

A power semiconductor device and thin cup members including the evaporating surface(s) of one (or two) nonwicked gravity-return heat pipe(s) are formed into a thin integral pressure interface-free unit which requires only a low clamping force for connection of the unit to sidewalls of the heat pipe when the unit is replaceable in the assembly of the heat pipe(s) and power semiconductor device. No clamping is required if the unit is more permanently joined to the side walls of the heat pipe(s).

26 Claims, 4 Drawing Figures

HEAT-PIPE COOLED POWER SEMICONDUCTOR DEVICE ASSEMBLY HAVING INTEGRAL SEMICONDUCTOR DEVICE EVAPORATING SURFACE UNIT

My invention relates to a heat-pipe cooled power semiconductor device assembly which utilizes an integral semiconductor device-evaporating surface unit, and in particular, to the integral unit which is a thin package and as a result substantially improves the transient response and reduces the steady-state thermal resistance thereof.

Semiconductor devices of various types are constantly being fabricated in larger sizes for power applications as distinguished from signal applications. The larger size of the device and higher current and power rating thereof requires an efficient means for removal of the heat generated within the device to maintain operation thereof within its rated steady-state and transient temperature limits. Since the future trend undoubtedly will be to increase the power rating of semiconductor devices even beyond those presently utilized, it is readily apparent that more efficient cooling means must be provided for such power devices.

Conventional cooling systems for power semiconductor devices are generally in the form of a finned heat sink which uses conduction heat transfer within the body of the heat sink as the means for transferring heat from the semiconductor device. An inherent limitation on the conventional finned heat sink fin performance results from the inefficiency in conduction heat transfer as the heat-transfer length (length of finned section and fin height) is increased. The semiconductor device-to-ambient thermal resistance possesses a conduction limit such that with a fixed cooling air flow velocity, adding more finned surface area by increasing the finned length or increasing the fin height, or with a fixed geometry, increasing the cooling air flow velocity, does not further decrease the thermal resistance.

Thus, one of the principal objects of my invention is to provide an improved cooling system for power semiconductor devices which is superior to the conventional finned heat sink ystem.

Another object of my invention is to provide the improved cooling system with superior steady-state and transient characteristics as compared to the conventional finned heat sink system.

Heat pipes are known devices for effecting heat transfer by vaporization of a liquid phase of a two-phase fluid coolant contained within a sealed chamber or pipe, by the application of heat to a vaporization, or evaporator, section of the chamber. The vaporization section of the heat pipe thus receives heat from the device being cooled and the heated vapor, being under a relatively higher vapor pressure, moves to the lower pressure area in the condensation section of the chamber, or pipe, by a substantially isothermal process wherein the vapor condenses and the condensate returns to the evaporator section to be vaporized again and, thus, repeat the heat transfer cycle. The condenser section of the heat pipe is, in effect, an air-cooled surface condenser functioning to reject heat to ambient air. A wick material disposed along substantially the entire inner surface of the heat pipe is conventionally used to pump the condensate to the vaporization section of the heat pipe by capillary action. Since the heat pipe does not utilize conduction as the eat transfer process (except for transferring the heat into and out of the heat pipe), and thereby overcomes the limitations inherent with the conventional finned heat sink due to its reduced efficiency of conduction heat transfer with increased path length, this suggests that the heat pipe may be a superior type device for use in cooling power semiconductor devices.

Therefore, another object of my invention is to provide an improved power semiconductor device assembly which uses heat-pipe cooling.

The use of heat pipes for cooling power semiconductor devices has recently become known. The first use of heat-pipe cooling of power semiconductor devices known to me is by Heat-Pipe Corporation of America of Westfield, N.J. whose sales brochure generally escribes heat pipes as being used to transport heat from electric motors, semiconductors, brakes and clutches and other heat producing devices. A publication prepared by the RCA Corporation at Lancaster, Pa, as a final technical report under contract DAAK02-69-C-0609 dated October 1972 discloses wicked heat-pipe cooled semiconductor thuristor devices in which the wick is in direct contact with the semiconductor device. This assembly, however, does not have the capability available in at least one embodiment of my invention for removal of the semiconductor device. That is, if the semiconductor device must be replaced, the heat pipe is also lost since the wick is integral therewith. The use of a wicked heat pipe in the RCA assembly introduces high thermal losses and the wick pumping losses increase with length thereby limiting the ength of heat pipe that may be effectively used. My invention uses a nonwicked heat pipe. Finally, a heat-pipe cooling of power semiconductor devices is also disclosed in a paper entitled APPLICATION OF HEAT PIPES TO THE COOLING OF POWER SEMICONDUCTORS by Edward J. Kroliczek of the Dynatherm Corporation of Cockeysville, Md. which describes the mounting of a power semiconductor device to a heat pipe which is distinguished from my invention is that a wicked heat pipe is utilized in the Dynatherm assembly. Also, the Dynatherm assembly uses two heat pipes for single-sided cooling, each being of small size in cross-section and of flat configuration which also ignificantly increases the thermal resistance. The rientation of the small heat pipes relative to the large cooling fins in the Dynatherm assembly also results in poor heat distribution since conduction heat transfer is required in transferring the heat laterally from the edges of the heat pipes to the outer portions of the fins.

Therefore, another object of my invention is to provide an improved heat-pipe cooled power semiconductor device assembly which uses a nonwicked heat pipe.

A further object my invention is to provide an improved heat-pipe cooled power semiconductor device assembly which has reduced thermal resistance and provides more efficient cooling capabilities.

A still further object of my invention is to provide an improved heat-pipe cooled power semiconductor device assembly wherein the power semiconductor device is a readily replaceable unit.

Copending patent applications Ser. No. 356,566 entitled HEAT-PIPE COOLED POWER SEMICONDUCTOR DEVICE ASSEMBLY and Ser. No. 356,565 entitled IMPROVED DOUBLE-SIDED HEAT PIPE COOLED POWER SEMICONDUCTOR DEVICE AS- SEMBLY, inventors Corman, et al, filed on May 2, 1973 and assigned to the same assignee as the present invention re directed to heat-pipe cooling of power semiconductor devices using nonwicked heat pipes of the gravity-return type. However, in such applications, the semiconductor device is clamped between two pressure plates of relatively large size under high pressure in order to obtain pressure interfaces which result in relatively low steady-state thermal resistance as well as decreasing the transient temperature rise for long term heat overloads. Although the inventions described in the above two identified patent applications are completely satisfactory, there are applications wherein it is desirable to form the semiconductor device and its support assembly as a thinner integral unit requiring no pressure interface in order to improve the transient response thereof as well as further reduce the steady-state thermal resistance.

Therefore, another object of my invention is to provide the improved heat-pipe cooled power semiconductor device assembly with a thinner power semiconductor device-support unit which has no pressure interfaces.

Briefly summarized, and in accordance with the objects of my invention, I provide a heat-pipe cooled power semiconductor device assembly which includes a power semiconductor device integral with thin cup members including the evaporating surfaces of two nonwicked gravity-return heat pipes in a double-sided cooled embodiment of my invention. This integral semiconductor device-evaporating surface unit contains no pressure interfaces since the body of semiconductor material is bonded or otherwise joined by means of the thin cup members to the evaporating surfaces of the heat pipes. In a first embodiment of my invention, the sides of the thin integral semiconductor device-evaporating surface unit, which also includes an increased creepage path means, are more or less permanently joined to the wall of the heat pipes, and no clamping force whatsoever is required. In a second embodiment, the sides of the thin integral semiconductor device-evaporating surface unit are sealed to the heat-pipes with O-rings and a low clamping force is required for retaining the two heat pipes and integral semiconductor device-evaporating surface unit in an assembly wherein the integral unit is readily replaceable. The evaporating surfaces of the heat pipes can each be a thin porous metallic structure which is sintered to a major surface of the thin cup member that is, in turn, joined to a major surface of the body of semiconductor material. Alternatively, the evaporating surface can be a thin, irregular surface formed by a plurality of metallic members such as small fins or posts which are joined to the major surface of the thin cup member. Due to the thin nature of the integral semiconductor devlice-evaporating surface unit, and absence of any pressure interfaces therein, the steady-state thermal resistance as well as the transient response of the thin integral semiconductor device-evaporating surface unit are significantly improved to thereby produce improved vaporization cooling of the semiconductor device.

The features of my invention which I desire to protect herein are pointed out with particularity in the appended claims. The invention itself, however, both as to its organization and method of operation, together with further objects and advantages thereof may best be understood by reference to the following description taken in connection with the accompanying drawings wherein like parts in each of the several figures are identified by the same reference character, and wherein:

Figures 1, 2, 3, 4:
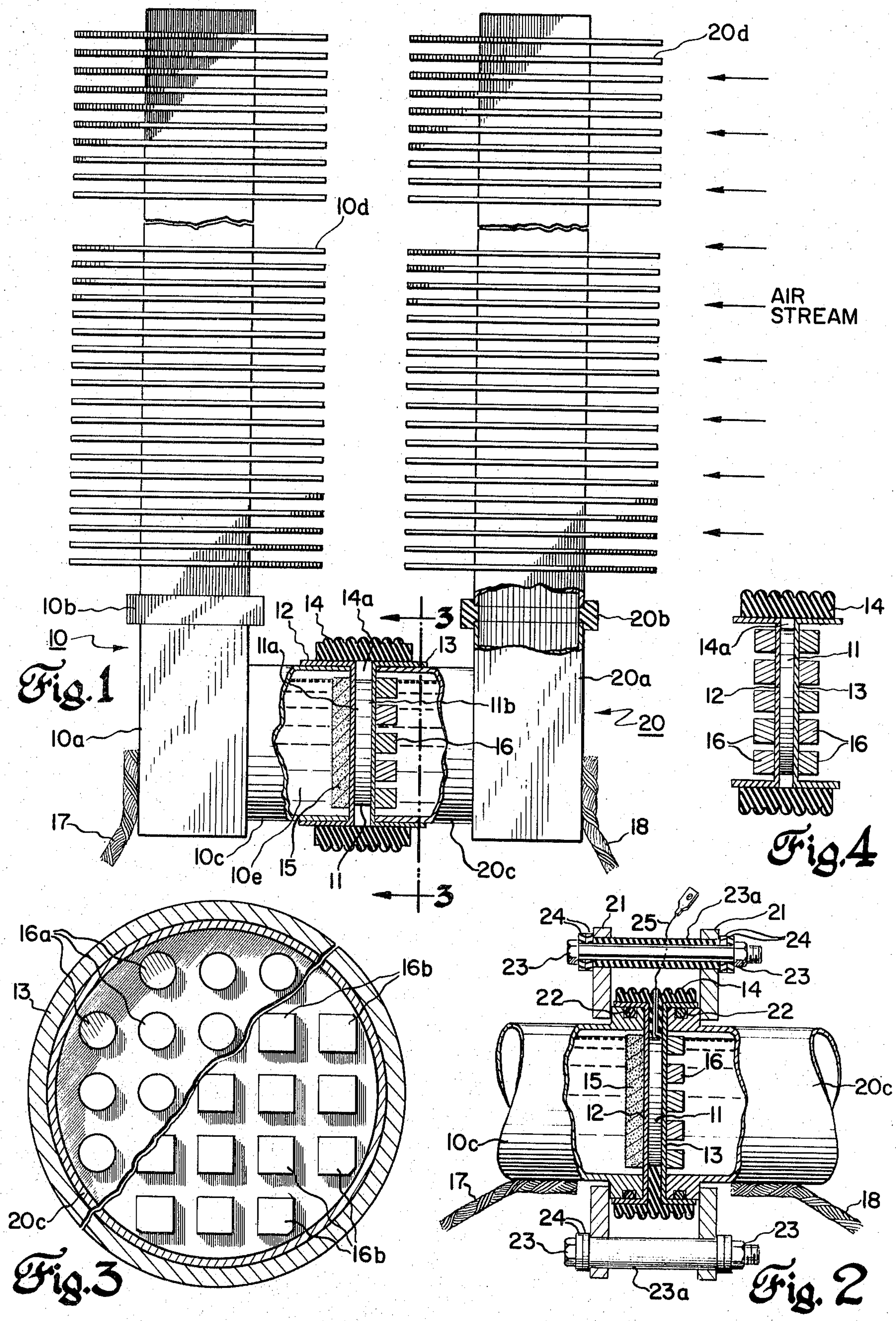
FIG. 1 is an elevation view, partly in section, of a first embodiment of my heat-pipe cooled power semiconductor device assembly wherein the integral semiconductor device evaporating surface unit is more or less permanently joined to the walls of the eat pipes.
FIG. 2 is an elevation view, partly in section, of the portion of the assembly illustrated in FIG. 1 showing the integral semiconductor device-evaporating surface unit in a second embodiment wherein the unit is easily replaceable.
FIG. 3 is an enlarged sectional view taken along the line 3—3 in FIG. 1 of two types of enhanced evaporating surfaces that may be joined to the thin cup member forming one end of each heat-pipe.
FIG. 4 is an elevation view in section of the integral semiconductor device-evaporating surface unit.

Referring now in particular to FIG. 1, there is shown a first embodiment of my invention wherein two non-wicked heat pipes of the gravity-return type, and designated as a whole by numerals 10 and 20, are used for obtaining double-sided cooling of a power semiconductor device 11. The power semiconductor device is defined herein as being a device which develops a thermal density of at least 100 watts per square inch along the surfaces thereof. Power semiconductor device 11 is a body of semiconductor material having first and second flat parallel major surfaces 11*a* and 11*b*, respectively, which define the body of semiconductor material therebetween. The fragile silicon junctions of body 11 would conventionally be protected against thermal and mechanical stresses by having one of the major surfaces in pressure contact with a substantial support plate fabricated of tungsten molybdenum as two typical metals, and the second major surface brazed or otherwise bonded to a second support plate as is the case in the two above-identified patent applications. Such conventional arrangement prevents cracking or other damage to the semiconductor body which could result from thermal expansion stresses caused by the excursion in junction emperature during transient operation which may be in the order of 200°C. Further, the support plate-semiconductor body layered device described in the two above-identified patent applications is retained in high pressure contact between two pressure plates which are clamped together for exerting a high pressure in the order of 2,000 pounds per square inch uniformly against the power semiconductor device. Such high pressure results in low thermal and electrical pressure interface resistances in the order of 0.015°C-inch$^2$/watt and $20 \times 10^{-6}$ ohm, respectively. Typical dimensions of the above-described pressure interface portion of a heat-pipe cooled power semiconductor device assembly are: the body of semiconductor material has a thickness of 10 mils and a diameter of 2,000 mils for a 700 ampere, 1,200 volts rated semiconductor device, the support plates are each of 40 mils thickness, and the pressure plates are each of 100 to 300 mils thickness. The pressure plates have significant heat storage capabilities due to their relative size and they cause a dampening of heat transients that may occur. However, the presence of pressure interfaces between the pressure plates and support plates, and between one of the support plates and semiconductor body limits the minimum overall silicon junction-to-ambient thermal and electrical resistances that can be achieved in the above-described heat-pipe cooled power semiconductor device assembly. My invention is directed to the elimination of such pressure interfaces.

As distinguished from the above-described pressure interface portion of a heat-pipe cooled power semiconductor device assembly, my invention eliminates the above-described pressure interfaces in the following anner. Major surfaces 11*a* and 11*b* of semiconductor body 11 are respectively brazed or otherwise bonded to the outer bottom surfaces of two very thin cup-like members 12 and 13 fabricated of a good thermally and electrically conductive high strength material having a coefficient of thermal expansion substantially equal to that of the semiconductor material. In the case of a silicon semiconductor body, cup members 12, 13 may be fabricated of molybdenum or tungsten as two typical metals. For the case of the abovedescribed 700 ampere, 1,200 volt rated semiconductor device, the thickness of each cup member 12 and 13 is generally in a range of 2 to 6 mils. It is the thinness of this dimension which avoids the build-up of thermal expansion stresses at the semiconductor body-cup member interfaces and thereby permits bonding type connections to be made rather than having to use a pressure interface. The evaporating surface function (or support for the enhanced surface) of these cup members, which is an equally important aspect of my invention, will be described following the description of the nonwicked gravity-return heat pipes.

The outer side wall portions of cup members 12 and 13 provide support for a creepage path lengthing means 14 which is a rubber, a ceramic or other electrically insulating material formed along substantially the full height of the side walls of cup members 12 and 13 for increasing the creepage path across the semiconductor device 11. The increased creepage path means 14 may be a ceramic composition, or a silicone rubber composition such as the type RTV produced by the General Electric Company and is preferably formed with an irregular outer surface to obtain an even greater creepage path to prevent arc-over between the cup members. In the case of a silicone rubber composition 14, as depicted in FIG. 2, it preferably entirely fills the void between cup members 12 and 13 to thereby also provide a dirt-free seal around power semiconductor device 11 and such rubber composition is then run along the outer side surfaces of the cup members to obtain the increased creepage path between the cup members and across the semiconductor device. In the case of a ceramic composition 14, as shown in FIG. 1, the ceramic need not fill the entire void between the cup members 12 and 13, and may have a straight bore inner diameter and the remaining space 14*a* between the cup members is preferably back-filled with an inert gas such as nitrogen, or may be filled with silicone rubber. The increased creepage path means 14, cup members 12 and 13 (with the evaporating surface enhancement means to be described hereinafter) and power semiconductor device 11 thus form a thin integral structure (illustrated separately in FIG. 4) which hereinafter will be described as the integral semiconductor device-evaporating surface unit. The need for increasing the creepage path between cup members 12 and 13 should be evident in view of the small thickness of the integral unit which may be as small as 14 mils for the above-described dimensions (cup thickness of 2 mils each) and typical semiconductor device anode-to-cathode potentials of 1,200 volts.

The heat pipes 10 and 20 are each a sealed chamber or pipe which includes a vaporization or evaporator section that is placed in contact with the source of heat (the semiconductor device to be cooled) and a condensation section which is at the opposite end of the chamber and may be separated by a distance therefrom up to several feet. A two-phase fluid coolant is contained within the heat pipes and effects heat transfer by vaporization of a liquid phase of the coolant resulting from heat conduction through cup members 12 and 13 from the power semiconductor device 11 to the evaporator sections of the heat pipes. The vaporization section of each heat pipe thus receives heat from the device being cooled and the heated vapor, being under a relatively higher vapor pressure, moves to the lower pressure area in the condensation section of the heat pipe which functions as a surface condenser where the vapor condenses and the condensate returns to the evaporator section to be vaporized again and, thus, repeat the heat transfer cycle. The condensation section of each heat pipe has a relatively high thermal mass due to the large surface area thereof, and is preferably provided with a finned heat exchanger to thereby function as an air-cooled surface condenser rejecting heat to ambient air which surrounds the condensation section. For more efficient removal of the heat to the ambient air, a fan or other means is utilized for obtaining forced air cooling by developing a sufficient air velocity of the ambient air passing by the cooling fins as depicted by the arrows in FIG. 1. In conventional heat pipes, a capillary pumping structure, or wick, is saturated with the liquid phase of the coolant and is used to pump the condensate to the evaporator section of the heat pipe by capillary action.

However, a wick is not essential to the operation of a heat pipe when it is of the gravity-feed type, that is, the heat pipe is oriented at some angle from the horizontal which need not be the extreme case of 90° indicated in FIG. 1. Conventional heat pipes are generally designed to operate in a horizontal orientation and within some range of angles from the horizontal. Each of the heat pipes illustrated in each of the above-identified publications is shown in a horizontal orientation, and, as such, require the wick for pumping the condensed fluid from the condensation section to the evaporator section. In the gravity-feed heat pipe, the condensed fluid returns to the evaporator section by gravity. The omission of the wick material along the various inner surfaces of my heat pipe results in reduced thermal resistance since the wick adds another thermal resistance (loss) component into the system. Further, the use of a wicked heat pipe limits the effective length of the heat pipe that may be used since the pumping losses associated with the wick increase with heat pipe length. For these reasons, I employ the gravity-return heat pipe in both the embodiments illustrated in FIGS. 1 and 2, and as a result obtain more efficient cooling.

Since the evaporating section (boiling surface) of each of my heat pipes is relatively small compared to the large surface area in the condensing section, it is desirable to increase such boiling (evaporating) surface area and/or change the local fluid flow patterns in order to obtain a greater maximum heat rejection rate from cup members 12 and 13 (and therefore also from semiconductor device 11). Therefore, for purposes of enhancing (increasing) the vaporization rate in my heat pipes, a means is formed along the inner bottom surface of each of cup members 12 and 13, which form one end of each heat pipe, for enhancing the evaporating surface of the vaporization section of the heat pipes. This boiling surface enhancement means may be layer structure 15 of generally uniform thickness in a range of 10 to 50 mils of a porous metallic material such as FOAMETAL, a product of Hogen Industries, Willoughby, Ohio, which is nickel as one typical example having a selected porosity in the range of about 60 to 95 percent and is illustrated as being sintered or otherwise joined to such inner bottom surface of cup member 12 for changing the local fluid flow pattern. Layer 15 may also be formed of porous copper or stainless steel, the latter metal of course not used when the coolant is water. Alternatively, this evaporating surface enhancement means is a thin irregular surface 16 formed by a plurality of small solid metallic members such as cylinders 16*a* or square posts 16*b* (also illustrated in FIG. 3) or small finned surfaces (short finned structure) which are suitably joined to inner bottom surfaces of cup member 13 for increasing the evaporating surface area. Obviously, the same evaporating surface enhancement means is generally used in both heat pipes in any one application as indicated in FIG. 4, and the illustration of the two different enhancement means in each of FIGS. 1 and 2 is merely to indicate two typical types that can be used. The irregular surface 16 in the form of the various type projecting members 16*a*, 16*b* or short fins may be formed of the same metals as used in the layer structure 15, that is, nickel, copper or stainless steel, as typical examples, or may be of the same or different metals as used in the cup members 12, 13. Such irregular surface metallic members would generally be separately fabricated and then joined to the cup member surface by sintering, low temperature brazing, or powdered metallurgy techniques as three examples. The cup member-irregular surface may even be integrally fabricated. As a typical example of the dimensions of the irregular surface members, they may be 0.15 inch in height, an 0.10 inch square along the top (outermost) surface and 0.15 inch center-to-center spacing between adjacent members, and would generally cover the entire inner bottom surfaces of the cup members.

Since the heat pipes do not utilize conduction as the heat transfer process (except for transferring the heat into and out of the heat pipe walls), the heat transfer through the length of each heat pipe is a substantially isothermal process of evaporation and condensation whereby the condensation section of the heat pipe is at substantially the same temperature as the evaporation section. This heat transfer process is also known as vapor phase heat transfer. The most distinguishing feature of the heat pipe over the conventional air cooled finned or water cooled heat sink is its ability to transfer heat along its length with substantially no temperature change and thereby is much more efficient in its cooling ability than the conventional heat sink.

In FIG. 1, my gravity-feed heat pipes 10 and 20 are each illustrated as being vertically oriented (although as mentioned above, such orientation may be much less than 90° from the horizontal) and the sealed chambers of the heat pipes are defined by side walls 10*a*, 20*a*, the cup members 12, 13 as one end wall at the evaporating sections and a suitable plug at each condenser section end. The heat pipe may be circular, square or rectangular as typical examples of the cross section thereof. In the case where the heat pipe is square or rectangular in cross section, power conductors 17 and 18 can readily be soldered or in other suitable manner connected to corresponding surfaces of heat pipes 10 and 20 adjacent the evaporator section ends thereof for supplying electrical power to the semiconductor device 11. The side wall of each heat pipe is fabricated of a metal having a high thermal conductivity such as copper and has a thickness in the order of 40 mils. As a typical example, for a power semiconductor device having a steady-state electrical current rating of 700 amperes, each heat pipe is 8 inches in length and 1.5 square inches in cross-sectional area. The plug may be fabricated of a compatible material such as copper and is suitably connected to the condenser section end of the heat pipe by brazing or any other well known metal joining process that assures a sealed chamber within the heat pipe. The side walls 10*a* and 20*a* of the heat pipes are also soldered, brazed or otherwise more or less permanently connected along the inner side walls of cup members 12 and 13 to respectively provide the proper seal therewith. The side walls 10*a*, 20*a* may be provided with electrically insulating collars 10*b*, 20*b* adjacent the evaporator section ends of the heat pipes in order to insulate the finned condensation sections of the heat pipes from the voltages applied through conductors 17, 18 to the semiconductor device 11 via the adjacent lower-most portions of the side walls, if such isolation is desired. Thus, each side wall 10*a*, 20*a* is generally in two (or more) sections separated by the insulating collar 10*b*, 20*b*, respectively. In the case of rectangular (or even square) cross section heat pipes, the lower-most portion 10*c*, 20*c* of each heat pipe which encloses the evaporating surface member 15 or 16 is preferably circular in cross-section and is horizontally oriented. This circular end portion 10*c*, 20*c* of the heat pipe is brazed or otherwise joined along the edges of a circular hole formed in the wider dimension side of the heat pipe adjacent the rectangular (or square) cross section base portion of the heat pipe.

The finned heat exchanger along the outer surface of the condensation section of each of our heat pipes consists of large fins 10*d*, 20*d* which may be of the folded fin or plate fin types and are fabricated of a high thermal conductivity material such as copper. The fins extend outward from the side walls of each heat pipe a distance generally in the range of 0.5 to 1.0 of the dimension between the opposing walls to which they are connected. For ease of fabrication, the heat pipe is often rectangular in cross section and the cooling fins are of length equal to the long dimension side of the heat pipe and are attached therealong.

The liquid state 10*e* of the two-phase fluid coolant is of small volume, and merely of sufficient depth in the evaporator section of each heat pipe to fully immerse the "heated" portion of the boiling surface enhancement means 16 (or 15) on the cup members 12, 13. The coolant 10*e* may be water, or a freon refrigerant, as typical examples. In operation, the heat generated in power semiconductor device 11 is conducted through cup members 12 and 13 to the evaporator surface enhancement means 16 (or 15) at which points it vaporizes the liquid coolant 10*e*. The vapor coolant then moves to the condenser section of each heat pipe due to a differential vapor pressure and condenses into the liquid state which returns to the evaporator section under the force of gravity. The heat of condensation is absorbed by the heat pipe condensation section walls which due to the large surface area have a high thermal mass, and is conducted to the finned heat exchanger 10*d*, and finally to the ambient air which is flowing thereby at a relatively fast rate to obtain forced air cooling of the fins.

Referring now to FIG. 2, there is shown a second embodiment of my invention, and in particular, is directed to a nonpermanent type of connection of the integral semiconductor device-evaporating surface unit to the sidewalls 10*c*, 20*c* of the heat pipes. Thus, in FIG. 2, a clamping means provides a low clamping force in the order of 10 pounds for retaining the two circular end portions 10*c* 20*c* of the two heat pipes. This clamping force does not, of course, result in any pressure interface(s) in the integral semiconductor device-evaporating surface unit. The evaporator section ends of the heat pipes (i.e., the ends of the circular portions adjacent the integral semiconductor device-evaporating surface unit) are flanged, and two washer-like members 21 are clamped together along the outer shoulder portions of the heat pipe flanged ends. O-ring seals 22 are provided (in small grooves formed in the flanged ends) between the flanged ends and integral semiconductor device-evaporating surface unit to assure a hermetic seal for the semiconductor device 11. The clamping means for the two flanged ends of the heat pipes, as one example, consists of a plurality of metallic nut-bolt assemblies 23 provided with suitable electrically insulating washers 24 wherein each bolt passes through aligned holes that have been formed in the washer-like members 21 as illustrated in FIG. 2. Alternatively, the washer-like members 21 may be fabricated integral with the flanged ends of the heat pipes and such assemblies then clamped together by means of the nut-bolt assemblies. The metal bolts are provided with suitable electrically insulating jackets 23*a* to prevent electrical short-circuiting across the heat pipe ends through the bolts. If desired, the electrical power conductors 17 and 18 may alternatively be suitably connected to the washer-like members 21 by being soldered to terminals connected thereto or to extending tab portions formed thereon as two examples. The bolt ring assembly in the FIG. 2 embodiment thus permits easy removal (and replacement) of the integral semiconductor device-evaporating surface unit from between the two heat pipes.

In the case wherein the power semiconductor device is of the three electrode type, the third electrode (generally described as the gate or control electrode) is provided with connection to a third electrical conductor 25 which may be brought out at the side of device 11 and through the increased creepage path means 14.

Referring now to FIG. 3, there are illustrated two of the irregular surface 16 evaporating surface enhancement means described hereinabove. Thus, small cylindrical 16*a* or square 16*b* posts project outwardly from the surface of cup member 13 normal thereto. These protruding members are preferably solid since high thermal conductivity is desired in the normal direction. Obviously, other geometry type posts could also be utilized, or the enhanced evaporating surface could be formed as a more irregular surface in that it need not be a regular or symmetric pattern of projecting members as depicted in FIG. 3.

The use of my integral semiconductor device-evaporating surface unit results in a (silicon) junction-to-evaporating surface steady-state thermal resistance of 0.004°C/watt (for 6 mil thickness molybdenum cup members) as compared to 0.036°C/watt for the embodiments described in the above-identified copending patent applications. This sharp reduction in steady-state thermal resistance is the result of the elimination of the pressure interfaces and much smaller volume of metal used in my thin integral semiconductor device-evaporating surface unit. The thinness of this unit thereby locates the evaporating surface very close to the semiconductor body junction to minimize the transient response time of the unit and thereby produce a fast thermal response system. Obviously, the thinness of the unit results in some sacrifice for short time heat transients compared to another type unit having equally good thermal interfaces and sufficient volume of heat storage material since the heat storage capability of the thin cup members 12, 13 is limited. However, as compared to the units disclosed in the above-described copending patent applications, my thin integral unit provides superior performance for both short time and long time transients, as well as for steady-state since the superior thermal interfaces and lack of pressure interfaces in my unit more than overcome the limited heat storage capability. But in the case of molybdenum or tungsten cup members, the thickness thereof cannot much exceed 6 mils without resulting in thermal expansion stresses during operation of the assembly causing damage to the semiconductor body. However, the cup members may be made thicker to obtain higher heat storage capabilities, by fabricating them of "softer" metals such as aluminum or copper. In such case, the cup thickness may be as much as 10 mils without causing damage to the semiconductor body due to thermal expansion stresses. In the case of the aluminum or copper cup members, an alloy joint or thermal compression process may be required to obtain the desired bond between the semiconductor body 11 and cup members 12 and 13. Such alloy joint or thermal compression process may also be used when the cup members are fabricated of the "stiffer" molybdenum or tungsten metals.

It is apparent from the foregoing that my invention obtains the objectives set forth in that it provides a cooling system for power semiconductor devices which is significantly superior to the conventional finned heat sink system both as to its steady-state and transient response characteristics. The elimination of the wick in my gravity-feed heat pipe removes one source of undesired thermal resistance and a possible limitation on total power handling capacity to thereby obtain a more efficient heat-pipe cooled power semiconductor device assembly. The thin integral semiconductor device-evaporating surface unit and elimination of pressure interfaces therein, also provides a much lower steady-state thermal resistance subassembly than those disclosed in the above-mentioned copending patent applications. This decreased steady-state thermal resistance results in the condenser section of my heat pipes being able to transfer heat to the ambient with greater efficiency than with conventional finned heat sinks or with the other heat-pipe cooled power semiconductor device assemblies enumerated above in the published art and copending patent applications and thereby obtaining a lower operating temperature of the semiconductor device. And since the integral power semiconductor device-evaporating surface unit includes the increased creepage path means, less cost is involved when a heat pipe must be replaced in the FIG. 2 embodiment. Finally, the electrically insulating collars 10*b*, 20*b* permit the forced air-cooled portions of my assembly to be outside a cabinet in which the integral power semiconductor device-evaporating surface unit may be mounted, and such finned portions 10*d*, 20*d* would thus be electrically isolated from the high voltage applied to the semiconductor body. Also, these electrically insulating collars permit the cooling fins 10*d* to be exposed to dirty air without the possibility of increased surface conduction along the creepage path around the semiconductor body that occurs with conventional finned heat sinks or heat pipes not having such collars and operating in dirty air.

Having described several embodiments of my double-sided heat-pipe cooled power semiconductor device assembly, it is believed obvious that modification and variation of such specific embodiments may readily be made by one skilled in the art. Thus, the assembly may readily be utilized as a single-sided cooled assembly by removing one of the heat pipes. It is, therefore, to be understood that changes may be made in the gravity-feed heat-pipe power semiconductor device assembly which are within the full intended scope of my invention as defined by the following claims.

What I claim as new and desire to secure by Letters Patent of the United States is:

1. A high pressure-interface-free heat-pipe cooled power semiconductor device assembly comprising a pressure-interface free integral power semiconductor device-evaporating surface unit including a power semiconductor device consisting of a body of semiconductor material defined by first and second flat parallel major surfaces, first and second thin cup-like members having outer bottom surfaces respectively bonded to the first and second flat parallel surfaces of the body of semiconductor material so that the power semiconductor device-cup like member unit is pressure-interface-free, said cup-like members fabricated of a good electrically and thermally conductive material, and creepage path lengthening means formed along outer side wall portions of said cup-like members for increasing the creepage path across said power semiconductor device, said power semiconductor device defined as developing a thermal density of at least 100 watts per square inch of surface area, a first long nonwicked gravity-return heat pipe having an open evaporator section end closed by and connected to said first cup-like member along the side wall portion thereof by high pressure-free means, an inner bottom surface of said first cup-like member functioning as an evaporating surface in the evaporator section end of said first heat pipe, said first nonwicked gravity-return heat pipe being substantially greater in length and having improved cooling characteristics than wicked heat pipes which are limited in length due to wick pumping losses, said integral power semiconductor device-evaporating surface unit further including means bonded only along the inner bottom surface of said first cup-like member for enhancing the evaporating surface thereof to thereby increase the rate of heat transfer from the first cup-like member to a liquid coolant in said first heat pipe which becomes vaporized, the close spacing between the evaporating surface and heat-emitting power semiconductor device due to the thinness of said first cup-like member and lack of any pressure interfaces in the integral power semiconductor device-evaporating surface unit substantially decreasing the steady-state thermal resistance as well as improving the transient response of the heat-pipe cooled power semiconductor device assembly to obtain improved single-sided vaporization cooling of the device superior to that obtained with conventional finned heat sink or wicked heat pipe assemblies.

2. The heat-pipe cooled power semiconductor device assembly set forth in claim 1 further comprising a second long nonwicked gravity-return heat pipe having an open evaporator section end enclosed by and connected to said second cup-like member along the side wall portion thereof by high pressure-free means, an inner bottom surface of said second cup-like member functioning as an evaporating surface in the evaporator section end of said second heat pipe, said integral power semiconductor device-evaporating surface unit further including means bonded only along the inner bottom surface of said second cup-like member for enhancing the evaporating surface thereof to thereby increase the rate of heat transfer from the second cup-like member to a liquid coolant in said second heat pipe which becomes vaporized to obtain improved double-sided vaporization cooling of the device superior to that obtained with conventional finned heat sink or wicked heat pipe assemblies.

3. The heat-pipe cooled power semiconductor device assembly set forth in claim 2 wherein said first and second nonwicked gravity-return heat pipes comprise first and second enclosed elongated hollow chambers having the evaporator sections at first ends thereof respectively defined by said first and second thin cup-like members and condenser sections at second ends thereof remote from the first ends, a two-phase fluid coolant contained within said chambers and being of sufficient volume in the liquid state to cause full immersion of at least the heated portion of the evaporation surface enhancing means in the liquid coolant, and first and second electrical conductors respectively connected to said assembly for supplying electrical power to said power semiconductor device.

4. The heat-pipe cooled power semiconductor device assembly set forth in claim 2 wherein at least a substantial portion of each of said first and second heat pipes is oriented at an angle greater than 0° with respect to the horizontal.

5. The heat-pipe cooled power semiconductor device assembly set forth in claim 3 and further comprising a third electrical conductor connected to said power semiconductor device which is of the three electrode type.

6. The heat-pipe cooled power semiconductor device assembly set forth in claim 3 wherein the condenser sections of said chambers are provided with cooling fins along the outer surfaces thereof for increasing the rate of heat transfer to ambient air surrounding said assembly.

7. The heat-pipe cooled power semiconductor device assembly set forth in claim 2 wherein said cup-like members are each of thickness in the range of 2 to 10 mils.

8. The heat-pipe cooled power semiconductor device assembly set forth in claim 7 wherein said cup-like members are fabricated of a metal selected from the group consisting of copper and aluminum.

9. The heat-pipe cooled power semiconductor device assembly set forth in claim 2 wherein said cup-like members are each of thickness in the range of 2 to 6 mils.

10. The heat-pipe cooled power semiconductor device assembly set forth in claim 9 wherein said cup-like members are fabricated of a metal selected from the group consisting of tungsten and molybdenum.

11. The heat-pipe cooled power semiconductor device assembly set forth in claim 2 wherein said evaporation surface enhancing means is a pair of porous metallic layer structures which are sintered to the inner bottom surfaces of said cup-like members.

12. The heat-pipe cooled power semiconductor device assembly set forth in claim 11 wherein said porous metallic layer structures are each of substantially uniform thickness in the range of 10 to 50 mils.

13. The heat-pipe cooled power semiconductor device assembly set forth in claim 12 wherein said porous metallic structures are each fabricated of a metal selected from the group consisting of copper, nickel and stainless steel.

14. The heat-pipe cooled power semiconductor device assembly set forth in claim 2 wherein said evaporation surface enhancing means is an irregular surface formed on the inner bottom surfaces of said cup-like members for increasing the surface area thereof.

15. The heat-pipe cooled power semiconductor device assembly set forth in claim 14 wherein said irregular surface consists of small fins formed of a heat conductive material.

16. The heat-pipe cooled power semiconductor device assembly set forth in claim 14 wherein said irregular surface consists of a plurality of small solid metallic members bonded to the inner bottom surfaces of said cup-like members.

17. The heat-pipe cooled power semiconductor device assembly set forth in claim 16 wherein said small solid metallic members are circular in cross section.

18. The heat-pipe cooled power semiconductor device assembly set forth in claim 16 wherein said small solid metallic members are square in cross section.

19. The heat-pipe cooled power semiconductor device set forth in claim 16 wherein said small solid metallic members are each approximately 0.15 inch in height.

20. The heat-pipe cooled power semiconductor device set forth in claim 16 wherein said small solid metallic members are fabricated of a metal selected from the group consisting of aluminum, copper, nickel, stainless steel, molybdenum and tungsten.

21. The heat-pipe cooled power semiconductor device assembly set forth in claim 6 and further comprising an electrically insulating collar connected between the condenser section and evaporator section of each of said nonwicked gravity-return heat pipes for electrically isolating the finned portion of the heat pipes from the power semiconductor device.

22. The heat-pipe cooled power semiconductor device assembly set forth in claim 2 wherein said creepage path lengthening means comprise a unitary layer of an electrically insulating material formed along outer side surfaces of said first and second cup-like members.

23. The heat-pipe cooled power semiconductor device assembly set forth in claim 22 wherein the unitary layer is of a ceramic composition, and provides a hermetic seal around said power semiconductor device.

24. The heat-pipe cooled power semiconductor device assembly set forth in claim 22 wherein the unitary layer is of a rubber composition and fills the entire void between said first and second cup-like members.

25. The heat-pipe cooled power semiconductor device assembly set forth in claim 3 wherein inner side wall surfaces of said first and second cup-like members are respectively bonded to the evaporator section ends of said first and second chambers so that the entire heat-pipe cooled power semiconductor device assembly is free of any pressure interfaces.

26. The heat-pipe cooled power semiconductor device assembly set forth in claim 3 and further comprising sealing means provided between inner side wall surfaces of said first and second cup-like members and outer side surfaces of the evaporator section ends of said first and second chambers, and clamping means for retaining said first and second heat pipes in a single assembly, said clamping means providing only a low clamping force which thereby results in said integral power semiconductor device-evaporating surface unit being an easily removable and replaceable component while still being free of any pressure interfaces.

* * * * *